United States Patent [19]

Frosien et al.

[11] Patent Number: 4,831,266

[45] Date of Patent: May 16, 1989

[54] DETECTOR OBJECTIVE FOR PARTICLE BEAM APPARATUS

[75] Inventors: Juergen Frosien, Ottobrunn; Hans-Peter Feuerbaum, Munich, both of Fed. Rep. of Germany

[73] Assignee: Siemens Aktiengesellschaft, Berlin and Munich, Fed. Rep. of Germany

[21] Appl. No.: 130,028

[22] Filed: Dec. 8, 1987

[30] Foreign Application Priority Data

Dec. 12, 1986 [DE] Fed. Rep. of Germany ....... 3642559

[51] Int. Cl.⁴ .......................................... H01J 37/244
[52] U.S. Cl. ........................... 250/347; 250/396 ML; 250/310
[58] Field of Search ........... 250/397, 396 R, 396 ML, 250/310

[56] References Cited

U.S. PATENT DOCUMENTS

| | | | |
|---|---|---|---|
| 3,896,308 | 7/1975 | Venables et al. | 250/310 |
| 4,110,622 | 8/1978 | Trotel | 250/396 R |
| 4,546,258 | 10/1985 | Chisholm | 250/396 R |
| 4,596,929 | 6/1986 | Coates et al. | 250/397 |
| 4,714,833 | 12/1987 | Rose et al. | 250/397 |
| 4,785,176 | 11/1988 | Frosien et al. | 250/396 ML |

OTHER PUBLICATIONS

Halbleiterdetektoren für ionisierende Strahlung, from Philips' Technische Rundschau, by W. K. Hofker, No. 12, 1966, pp. 323–337.

Co-pending U.S. application Ser. No. 30,964, filed 3/27/87.

"The Encyclopedia of Physics", by Robert M. Besancon, p. 278.

"Elektronenoptik", vol. 1 (Grundzuege der theoretischen Elektronenoptik), Verlap Birkhauser, Basel (1950), by A. Rusterholz.

Primary Examiner—Bruce C. Anderson
Assistant Examiner—Jack I. Berman
Attorney, Agent, or Firm—Hill, Van Santen, Steadman & Simpson

[57] ABSTRACT

A detector objective forms a component of an electron-optical column of a scanning electron microscope, the detector objective being composed of an asymmetrical magnetic lens, an electrostatic immersion lens generating a substantially rotationally symmetrical field, and an annular detector disposed immediately above the magnetic lens body. An electrode of the electrostatic immersion lens is formed as a truncated cone and is arranged in insulated fashion in an upper pole piece of the magnetic lens. The lower pole piece forms the second electrode of the immersion lens. The first and second electrodes are charged with potentials that establish an electrical field for decelerating the primary electrons, the electrical field overlying the focusing magnetic field.

22 Claims, 1 Drawing Sheet

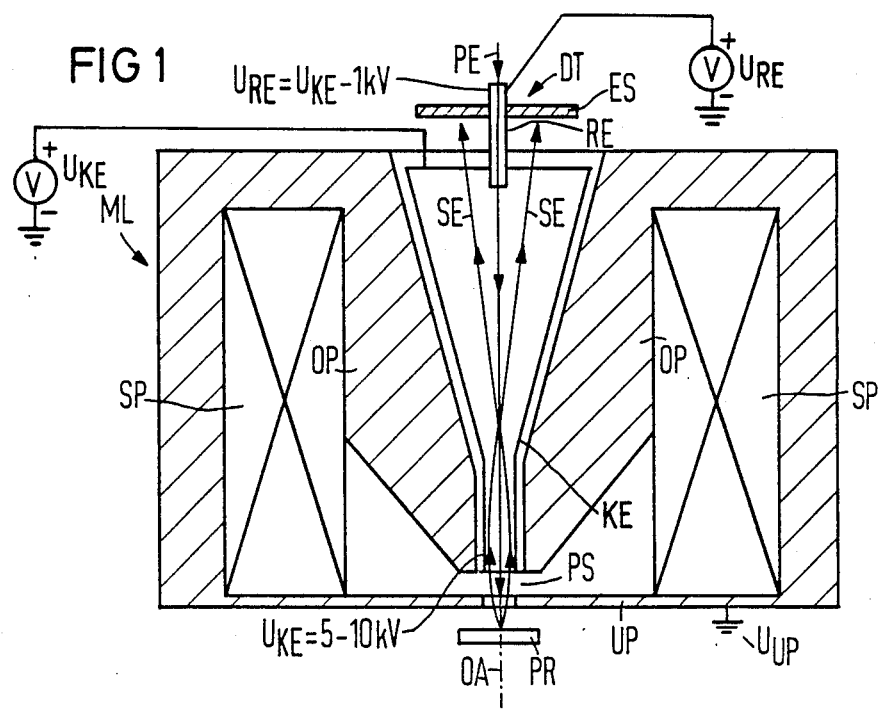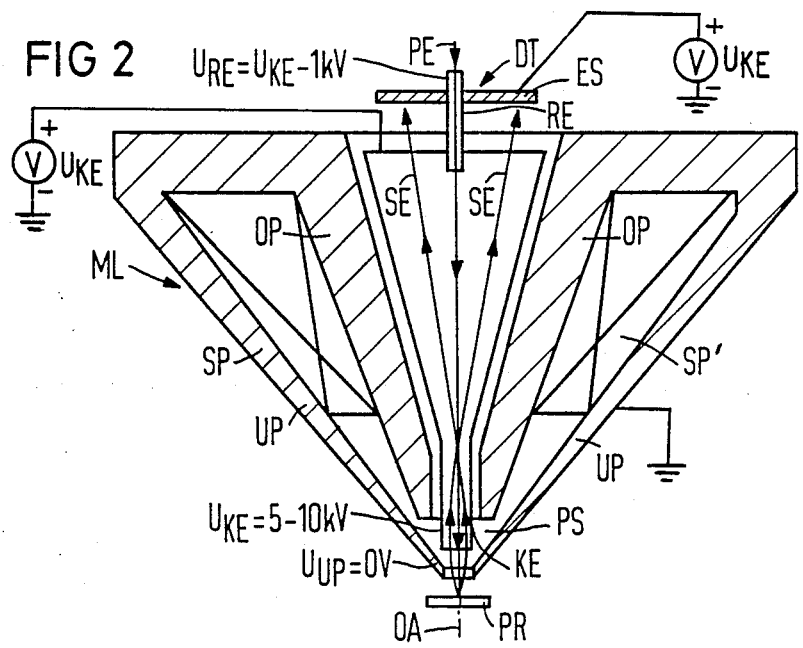

DETECTOR OBJECTIVE FOR PARTICLE BEAM APPARATUS

BACKGROUND OF THE INVENTION

1. Field of the Invention

The present invention is related generally to a particle beam apparatus, and more particularly to a detector objective for the particle beam apparatus.

2. Description of the Related Art

The electrical properties of modern VLSI microelectronic and opto-electronic components are critically influenced by the geometrical stuctural dimensions of their module components. The observation of strict dimensional tolerances is therefore an indispensable precondition during the manufacture of functional components which have constant physical-electrical properties. This is particularly true when the geometrical dimensions of fine structures, for example, interconnects or fingers of a transducer, are within the micrometer or sub-micrometer range through the use of modern lithographic methods.

All areas of development and manufacture of LSI microelectronic and opto-electronic components, therefore, have an increasing need for high resolution imaging systems to provide a process-proximate inspection and measurement of the generated structures. Scanning electron microscopes have proven particularly well suited for these purposes. Micrometer size and and submicrometer size structrures are capable of being visually evaluated with the aid of scanning electron microscopes so that errors and deviations from the intended patterns are capable of being identified. Also, topographical data such as lengths, widths, heights or angles of inclination are capable of being acquired and interpreted. In all such investigations of microelectronic components using a scanning electron microscope, it must be assured that modifications of the substrate, such as due to contamination or radiation damage, are avoided.

Conventional scanning electron microscopes that achieve a resolution in the range of a few nanometers currently do so by using high acceleration voltages of above approximately 20kV, at which resist structures and the circuits themselves are damaged by the high energy electrons. Also, such high accelerating voltages cause the non-conductive or poorly conducive surface regions of the specimen to become electrically charged. It is standard procedure to apply a metal layer to the surface of the specimen in order to avoid such electrical charges. However, metallization of the specimen deteriorates the resolution and the image quality for such small structures so that it is no longer suitable for investigating microelectronic and opto-electronic components. Also, the applied metal layer disturbs the function of the component and intolerably modifies it so as to prevent further process-oriented handling.

SUMMARY OF THE INVENTION

An object of the present invention is to provide a detector objective with noticeably enhanced resolution and detector efficiency at low acceleration voltages in a particle beam apparatus. The present detector objective is particularly applied to a scanning electron microscope.

This and other objects of the present invention are achieved in a detector objective having a magnetic lens generating a rotationally symmetrical magnetic field and an electrostatic immersion lens generating a nearly rotationally symmetrical electrical field and having two electrodes lying at different potentials, the electrodes being disposed within the magnetic lens symmetrically relative to its axis of symmetry. A detector is arranged above a pole piece gap of the magnetic lens symmetrically relative to the axis of symmetry for documenting secondary particles triggered by a primary particle beam directed at a specimen.

An advantage obtainable with the present invention is that particle probes having a small beam cross section can be generated for high beam currents and low accelerating voltages. Furthermore, this guarantees high resolution and nearly charge-neutral investigation of non-conductive or poorly conductive specimens.

Further embodiments and developments of the invention include, for example, providing the magnetic lens with a bore in an upper pole piece with the bore tapering in the shape of a truncated cone in the direction of the specimen, and forming the first electrode of the immersion lens as a truncated cone having a hollow cylindrical projection.

BRIEF DESCRIPTION OF THE DRAWINGS

FIG. 1 is a schematic vertical cross section showing an exemplary embodiment of a detector objective of the present invention for use in a scanning electron microscope; and FIG. 2 is a schematic vertical cross section of a second embodiment of the present detector objective.

DESCRIPTION OF THE PREFERRED EMBODIMENTS

A detector objective is shown schematically in FIG. 1 for use as a component of an electron-optical column of a scanning electron microscope with which a primary electron beam PE generated by a high-current source is focused onto a specimen PR. The specimen PR is preferably a microelectronic or opto-electronic component. The detector objective is essentially composed of an asymmetrical magnetic lens ML, an electrostatic immersion lens KE and UP which generates an electrical field that is nearly rotatationally symmetrical, and of a detector DT arranged above a pole piece gap PS. The detector DT is also arranged immediately above the lens body in the illustrated example and documents secondary electrons SE triggered at the specimen PR by the primary electron beam PE. Alternately, the detector DT can lie within the body of the magnetic lens ML.

To guarantee optimally short focal lengths and, thus, low chromatic aberration constants $C_F$ of the objective lens, the magnetic flux generated by an excitation coil SP is concentrated into a small spacial region around an axis of symmetry OA of the system with the assistance of upper and lower polepieces OP and UP. The chromatic aberration constants $C_F$ are approximately equal to f, where f equals the focal lengths of the imaging system. The magnetic field is nearly rotatationally symmetrical about the axis of symmetry OA and reaches its maximum strength in a pole piece gap PS. One electrode KE of the electrostatic immersion lens is preferrably in the form of a truncated cone tapering in the direction of the specimen PR and includes a cylindrical projection in the region of the pole piece gap PS in the illustrated exemplary embodiment. The electrode KE is arranged in insulating fashion within a bore in the upper pole piece OP of the magnetic lens ML and concentrically with the symmetry axis OA thereof. The bore in the upper pole piece OP is likewise shaped as a truncated cone.

The lower pole piece UP of the magnetic lens ML preferably lies at ground potential $U_{UP}$ and can be lined with a beam guidance tube of magnetic or non-magnetic material (not shown in FIG. 1) for protection against contamination. The lower pole piece UP, thus, forms the lower electrode of the electrostatic immersion lens KE and UP.

In order to establish a nearly rotationally symmetrical, electrical retarding field or opposing field within the detector objective, the upper electrode KE of the immersion lens is placed at a positive potential $U_{KE}$ relative to the lower pole piece UP, where the positive potential $U_{KE}$ is of, for example, 5 through 10 kV.

The imaging properties of the electron-optical unit composed of an electrostatic immersion lens KE and UP and of a magnetic lens ML are essentially determined by the electrode potentials $U_{KE}$ and $U_{UP}$, by the dimensions of the electrodes, and by the strength of the magnetic field in the pole piece gap PS. It is, thus, not necessary at all to form the upper electrode KE as a truncated cone for improved imaging properties. A hollow cylindrical electrode (not shown) could also be arranged in a likewise cylindrical bore in the upper pole piece OP.

As a result of the electrical retarding field of the immersion lens KE and UP superimposed on the focusing magnetic field, the detector objective of the present invention exhibits noticably lower chromatic and spherical aberrations than does the magnetic lens ML as used in a conventional operation where $U_{KE}$ 0. Thus, when the electrons are decelerated in the detector objective to one tenth of their primary energies, chromatic and spherical aberration constants $C_F$ of the composite system essentially determined by the difference in potentials $U_{KE}$ and $U_{UP}$ built up between the electrodes KE and UP of the immersion lens are reduced by a factor of about 10 compared to those of a single magnetic lens. This is true for the immersion lens having the electrode KE shaped as a truncated cone and the electrode UP in the form of the lower pole piece. The primary energy referred to above is the kinetic energy of the electrons in the beam path immediately above the detector objective. The detector objective of the invention also has the advantage that its electron-optical properties can be realized very well in practice because of the excellent and simple centerability of the electrical and magnetic lenses.

In the illustrated exemplary embodiment, the detector DT for documenting the secondary electrons SE triggered by the primary electrons PE at a measuring point on the specimen PR is arranged immediately above the lens body symmetrically relative to the axis of symmetry OA. The detector DT is preferably of an annular, electron-sensitive part ES that includes a hollow cylinder RE fitted into a central bore therein. The hollow cylinder RE is mounted in insulating fashion in the detector DT for shielding the primary electron beam PE from the high voltage of, for example, 10 kV applied to the detector DT. The hollow cylinder RE, which can be charged with a somewhat lower, positive potential $U_{RE}$ compared to the upper electrode KE of the immersion lens for deflecting the secondary electrons SE moving at a small angle relative to the symmetry axis OA, extends into the interior of the lens body.

The voltage of the hollow cylinder RE is in the range of $U_{KE}-1$ kV $\pm U_{RE} \pm U_{KE}$.

For use as the detector DT are the semiconductor detectors disclosed, for example, in the publication by W. K. Hofker, Philips Technische Rundschau No. 12, 1966, pages 323 through 337, whose particle-sensitive regions ES may be constructed in segmented fashion and are formed as a metal-to-semiconductor of P-N junction. Of course, scintillator light-guide combinations or channel plates can also be used, as well as surface barrier layer detector. It is also possible to provide an embodiment differing from FIG. 1 in that an annular secondary electron detector is arranged inside the lens body which exhibits the advantage, as compared to other detector configurations, that nearly all of the secondary electrons SE extracted from the specimen PR by the positive potential $U_{KE}$ of the upper electrode KE and focused in the field of the magnetic lens ML are detected. To avoid wall contact by the secondary electrons SE, care should be exercised to see that the dimensions of the conical or cylindrical bore in the upper pole piece OP are larger than the maximum diameter of the divergent secondary electron beam generated inside the detector objective.

A second embodiment of a detector objective having a conical magnetic lens ML' is shown schematically in FIG. 2, in which corresponding parts are assigned corresponding reference characters. The conical objective lens is preferably used in a scanning electron microscope when large-area specimens are to be imaged and investigated in a tilted condition relative to the primary electron beam PE, as well as when a small working distance, i.e., the distance between the specimen PR and a lower pole piece plate UP', is used. As a consequence of the shape of the pole pieces OP' and UP', however, the conical magnetic lens formed thereby has a larger pole piece gap PS' and, thus, a relatively longer focal length, which in turn causes relatively greater chromatic and spherical aberrations.

Due to the arrangement, as shown in FIG. 2, of the electrode KE in the shape of a truncated cone within the upper pole piece OP' and lying at a positive potential $U_{KE}$, the imaging properties of the electron-optical unit formed by the conical magnetic lens M' and the electrostatic immersion lens KE and UP' are noticably improved compared to those of a single conical lens where $U_{KE}=0$ volts. This is also true for arrangements where the electrode KE has a cylindrical shape rather than a truncated conical shape. The positive potential $U_{KE}$ here is approximately equal to $+5$ through $+10$ kV. This improvement in the optical properties is achieved by reducing the chromatic and spherical aberration constants set forth above and by a shift of the principle plane of the conical magnetic lens ML' in the direction of the specimen P. This in turn has a beneficial effect on the aberrations due to shortening of the focal length which is involved therewith (the chromatic aberration constant $C_F$ is approximately equal to the focal length). In the exemplary embodiment, too, the lower pole piece UP', which preferably lies at a ground potential $U_{UP'}$, in the magnetic lens ML' forms an electrode of the electrostatic immersion lens KE and UP'.

The resolution of a scanning electron microscope is proportional to a beam diameter d of the primary electron beam PE on the specimen PR, which is essentially determined at low accelerating voltages by the Coulomb repulsion of the electrons (Boersch effect) opposing the focusing of the beam and by the axial chromatic aberration of the imaging lens. The axial chromatic aberration increases with the chromatic aberration constant $C_F$ and, for a constant energy distribution width $e \pm U$ of the energy distribution of the electrons, decreases with a primary energy e U. For the resolution-defining probe diameter d on the specimen is the known relationship where $d_o$ refers to the geometric-optical probe diameter as expanded by the Coulomb repulsion of the electrons between a beam generator and the specimen PR, also known as the lateral Boersch effect, and $d_F$ refers to the diameter of the chromatic aberration disc produced by the chromatic aberration which, from the relationship is dependent on the beam aperture, on the chromatic aberration constant $C_F$ of the lens, on the primary energy eU where U is the accelerating voltage, and on the width of the energy distribution $e \pm U$ of the primary electrons. An improvement in the resolution of a scanning electron microscope is achieved only by reduction of the disadvantageous influences of the electron-electron interaction and of the chromatic aberration constant $C_F$ of the lens used. The electron-electron interaction is reduced by reducing the energetic Boersch effect influencing the energy width $e \pm U$ and the lateral Boersch effect influencing the probe diameter.

Detector objectives of the present invention are therefore advantageously used in scanning particle microscopes and preferably in scanning electron microscopes, where the Boersch effect limits the resolution, particularly at low accelerating voltages, and where conventional objective lenses exhibit excessive aberrations. Since the influence of the lateral Boersch effect on the probe diameter decreases with increased kinetic energy e U, but the width of the energy distribution $e \pm U$ of the primary electrons PE noticably increases, particulary in the beam generator as a consequence of the energetic Boersch effect, the electrons should preferrably traverse a first beam cross-over, or source cross-over, with low energy, for example, in the range of 2 keV. The electrons are subsequently accelerated to higher energies, for example, of 10 keV, and then decelerated to the desired low ultimate energy of, for example, 1 keV only briefly before they reach the specimen PR. For the purposes of decelerating and focusing the primary electrons PE, a detector objective of the invention is preferrably used in place of the conventional objective lens in an electron-optical column of the scanning electron microscope. The upper electrode KE lies at an anode potential of, for example, 9 kV for an assumed cathode potential of $-1$ kV and accelerates the electrons to 10 keV and a desired ultimate energy of 1 keV.

The invention, of course, is not limited to the exemplary embodiments shown in FIGS. 1 and 2. For example, it is also possible to use symmetrical magnetic lenses for the detector objective, where the detector DT can also be entirely arranged within the lens.

Electrodes of the electrostatic immersion lens UP and KE, of course, can also be charged with potentials which differ from the potentials $U_{KE}$ and $U_{UP}$ recited above. However, it must be noted that an improvement of the imaging properties of the composite system only occurs when the focusing field of the magnetic lens ML is overlayed by an electrical retarding field which decelerates the primary electrons PE. Thus, it is also possible to place the lower pole piece UP and the specimen PR at a potential different from 0 volts in common when the potential $U_{KE}$ of the upper electrode KE of the immersion lens is correspondingly different at the same time.

Although other modifications and changes may be suggested by those skilled in the art, it is the intention of the inventors to embody within the patent warrented hereon all changes and modifications as reasonably and properly come within the scope of their contribution to the art.

We claim:

1. A detector objective for a particle beam apparatus, comprising:
    a magnetic lens for focusing a particle beam to a specimen;
    a detector arranged above a pole piece gap of said magnetic lens for detecting secondary particles triggered on the specimen;
    an electrostatic immersion lens overlying said magnetic lens said immersion lens having an upper electrode and a lower electrode;
    means for establishing a first potential at said upper electrode;
    means for establishing a second potential at said lower electrode to form an electrical field in said immersion lens, said first and second potentials being selected so that particles in said electrical field of said immersion lens are slowed down from a first energy to a second lower energy.

2. A detector objective as claimed in claim 1; wherein said first electrode of said electrostatic immersion lens is formed as a truncated cone of a hollow cylindrical projection at one end.

3. A detector objective as claimed in claim 1, wherein said magnetic lens has an axis of symmetry, said magnetic lens generating a substantially rotationally symmetrical magnetic field;
    said electrostatic immersion lens generating a substantially rotationally symmetrical electrical field,
    said electrostatic immersion lens being disposed within said magnetic lens.

4. A detector objective as claimed in claim 1, wherein said magnetic lens has an upper pole piece, and said first electrode of said electrostatic immersion lens is disposed in a bore in said upper pole piece.

5. A detector objective as claimed in claim 1, wherein said magnetic lens includes a lower pole piece and said lower pole piece forms said second electrode of said electrostatic immersion lens.

6. A detector objective as claimed in claim 1, wherein said magnetic lens includes an upper pole piece having a bore, said bore tapering in a shape of a truncated cone directed toward the specimen.

7. A detector objective as claimed in claim 1, wherein said magnetic lens includes an upper pole piece having a cylindrical bore.

8. A detector objective as claimed in claim 1, wherein said first electrode of said electrostatic immersion lens is in the form of a hollow cylinder.

9. A detector objective as claimed in claim 1, wherein said detector is disposed within a body of said magnetic lens.

10. A detector objective as claimed in claim 1, wherein said detector is disposed immediately above a body of said magnetic lens.

11. A detector objective as claimed in claim 1, wherein said detector is an annular detector that includes a hollow cylindrical shield disposed concentrically relative to said axis of symmetry of said magnetic lens.

12. A detector objective as claimed in claim 11, further comprising:
   means for maintaining said hollow cylindrical shield at a potential which is no more than a potential present at said first electrode of said electrostatic immersion lens.

13. A detector objective as claimed in claim 1, wherein said detector is a scintillator light guide combination.

14. A detector objective as claimed in claim 1, wherein said detector is a semiconductor detector.

15. A detector objective as claimed in claim 1, wherein said detector is a surface barrier layer detector.

16. A detector objective as claimed in claim 1, wherein said detector includes a particle sensitive region formed as a plurality of segments 17. A detector objective as claimed in claim 1, wherein said magnetic lens is symmetrical.

18. A detector objective as claimed in claim 1, wherein said magnetic lens is asymmetrical.

19. A detector objective as claimed in claim 1, wherein said magnetic lens is conical.

20. A detector objective as claimed in claim 1, wherein said first electrode of said electrostatic immersion lens is connected to means for providing at a positive potential, and said magnetic lens includes a lower pole piece connected to means for maintaining ground potential.

21. A detector objective as claimed in claim 1, further comprising:
   means for establishing a potential at said first electrode which is greater than a potential at said second electrode of said electrostatic immersion lens.

22. A detector objective for a particle beam apparatus, comprising:
   a magnetic lens defining a pole piece gap and having an axis of symmetry, said magnetic lens generating a substantially rotationally symmetrical magnetic field; an electrostatic immersion lens for generating a substantially rotationally symmetrical electrical field and including first and second electrodes lying at mutually different potentials, said electrostatic immersion lens being disposed within said magnetic lens symmetrically relative to said axis of symmetry; and a detector disposed above said pole piece gap of said magnetic lens symmetrically relative to said axis of symmetry, said detector documenting secondary particles triggered by a primary particle beam directed toward a specimen,
   said first electrode of said electrostatic immersion lens being formed as a truncated cone having a hollow cylindrical projection at one end.

* * * * *